US010967754B2

(12) United States Patent
Tabatowski-Bush et al.

(10) Patent No.: US 10,967,754 B2
(45) Date of Patent: Apr. 6, 2021

(54) ELECTRIFIED VEHICLE CONTACTOR STATUS

(71) Applicant: Ford Global Technologies, LLC, Dearborn, MI (US)

(72) Inventors: Benjamin A. Tabatowski-Bush, Ann Arbor, MI (US); Wesley Edward Burkman, Dearborn, MI (US); Baojin Wang, Ypsilanti, MI (US); John Paul Gibeau, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 368 days.

(21) Appl. No.: 16/123,733

(22) Filed: Sep. 6, 2018

(65) Prior Publication Data

US 2020/0079222 A1 Mar. 12, 2020

(51) Int. Cl.
*B60L 58/12* (2019.01)
*B60L 58/21* (2019.01)
*B60L 3/12* (2006.01)
*B60L 3/00* (2019.01)
*B60L 15/20* (2006.01)
*H02P 3/22* (2006.01)
*G01R 31/00* (2006.01)

(52) U.S. Cl.
CPC ............... *B60L 58/12* (2019.02); *B60L 58/21* (2019.02); *B60L 3/0046* (2013.01); *B60L 3/12* (2013.01); *B60L 15/20* (2013.01); *G01R 31/006* (2013.01); *H02P 3/22* (2013.01)

(58) Field of Classification Search
CPC .. B60L 58/12; B60L 58/21; B60L 3/12; B60L 3/0046; B60L 15/20; B60L 3/0023; B60L 3/04; B60L 3/00; B60L 53/12; B60L 58/10; H02P 3/22; G01R 31/006; Y02T 10/7072; Y02T 90/14; Y02T 10/70
See application file for complete search history.

(56) References Cited

U.S. PATENT DOCUMENTS

| 5,668,693 | A  | * | 9/1997 | Tennies | H01H 47/002 361/187 |
| 7,740,225 | B1 | * | 6/2010 | Estelle | F16K 31/0665 251/129.05 |
| 9,561,738 | B2 |   | 2/2017 | Ogawa et al. | |
| 9,931,960 | B2 |   | 4/2018 | Tabatowski-Bush et al. | |
| 2008/0036562 | A1 | * | 2/2008 | Adunka | H01H 1/0015 335/156 |
| 2015/0329004 | A1 | * | 11/2015 | Sakai | B60L 53/18 701/22 |
| 2016/0238665 | A1 |   | 8/2016 | Kleppe | |
| 2017/0350942 | A1 | * | 12/2017 | Kinsella | G01R 19/165 |
| 2018/0105059 | A1 | * | 4/2018 | Namou | H02J 7/0072 |

* cited by examiner

*Primary Examiner* — Donald J Wallace
(74) *Attorney, Agent, or Firm* — David B. Kelley; Brooks Kushman P.C.

(57) ABSTRACT

A system for a vehicle includes a controller and contactor arranged to close responsive to current magnitude through a coil thereof exceeding a first threshold. The controller, following a request to open the contactor, applies current to the coil at a magnitude less than the first threshold for a duration, and responsive to peak current through the contactor during the duration being less than a second threshold, prevents start of the vehicle.

16 Claims, 3 Drawing Sheets

ELECTRIFIED VEHICLE CONTACTOR STATUS

TECHNICAL FIELD

This disclosure relates to systems and methods for the detection of contactor status for electrified vehicles, such as hybrid, plug-in hybrid, and electric vehicles.

BACKGROUND

Electrified vehicles, including hybrid, plug-in hybrid, and electric vehicles, are designed to be propelled or partially propelled by one or several electric machines, such as AC inductive machines, DC brushless electric machines, and permanent magnetic synchronous machines. Battery packs are included in the electrified vehicles providing electricity to electric machines. The battery packs are also referred to as traction batteries or traction battery packs. Hybrid and plug-in hybrid vehicles also have built-in internal combustion engines able to charge the battery packs and/or propel the electrified vehicles together with electric machines. The battery packs include multiple battery cells in series and/or in parallel to achieve high voltage and/or high output power to meet the requirements of the electric machines. The battery packs also provide power to other equipment and circuits inside of the electrified vehicles, such as DC-DC converters, on-board generators, and air conditioning systems.

A battery pack can be monitored and controlled by a Battery Management System (BMS), also referred to as a Battery Energy Control Module (BECM). The BECM performs multiple functions, such as battery State of Charge (SOC) estimation, battery State of Health (SOH) estimation, battery power limit estimation, battery overvoltage/undervoltage protection, battery overcharge/over discharge protection, battery overcurrent protection, battery over temperature protection, battery end of life judgment, leakage current detection, pre-charge control, contactor status determination, etc. These statuses are provided by the BECM via a vehicle communication network to other electric control modules inside the electrified vehicle or a cloud data center for further determinations.

SUMMARY

A system for a vehicle includes a contactor, including a coil, arranged to close responsive to current magnitude through the coil exceeding a first threshold, and a controller that, following a request to open the contactor, applies current to the coil at a magnitude less than the first threshold for a duration, and responsive to peak current through the contactor during the duration being less than a second threshold, prevents start of the vehicle.

A method for a vehicle includes, by a controller, following a request to open a contactor, including a coil, arranged to close responsive to current magnitude through the coil exceeding a first threshold, applying current to the coil at a magnitude less than the first threshold for a duration, and responsive to peak current through the contactor during the duration being less than a second threshold, setting a fault condition flag.

A system for a vehicle includes a contactor arranged to electrically connect a traction battery and high voltage bus, and a controller that applies current to a coil of the contactor at a duty cycle during propulsion of the vehicle via the traction battery to command the contactor closed, and selectively sets a fault condition flag according to a rate of decay of the current through the coil during an off portion of the duty cycle.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Contactors can be important in electric vehicle design. There are usually two issues that impact contactors. The first is an unintended open while the contactor is supposed to be closed, and the second is contact welding, in which the contactor will not open again. Before describing a traditional method to diagnose unintended open and contact welding conditions, and proposed methods for doing the same, some introduction to vehicle componentry may be helpful.

Figure 1:
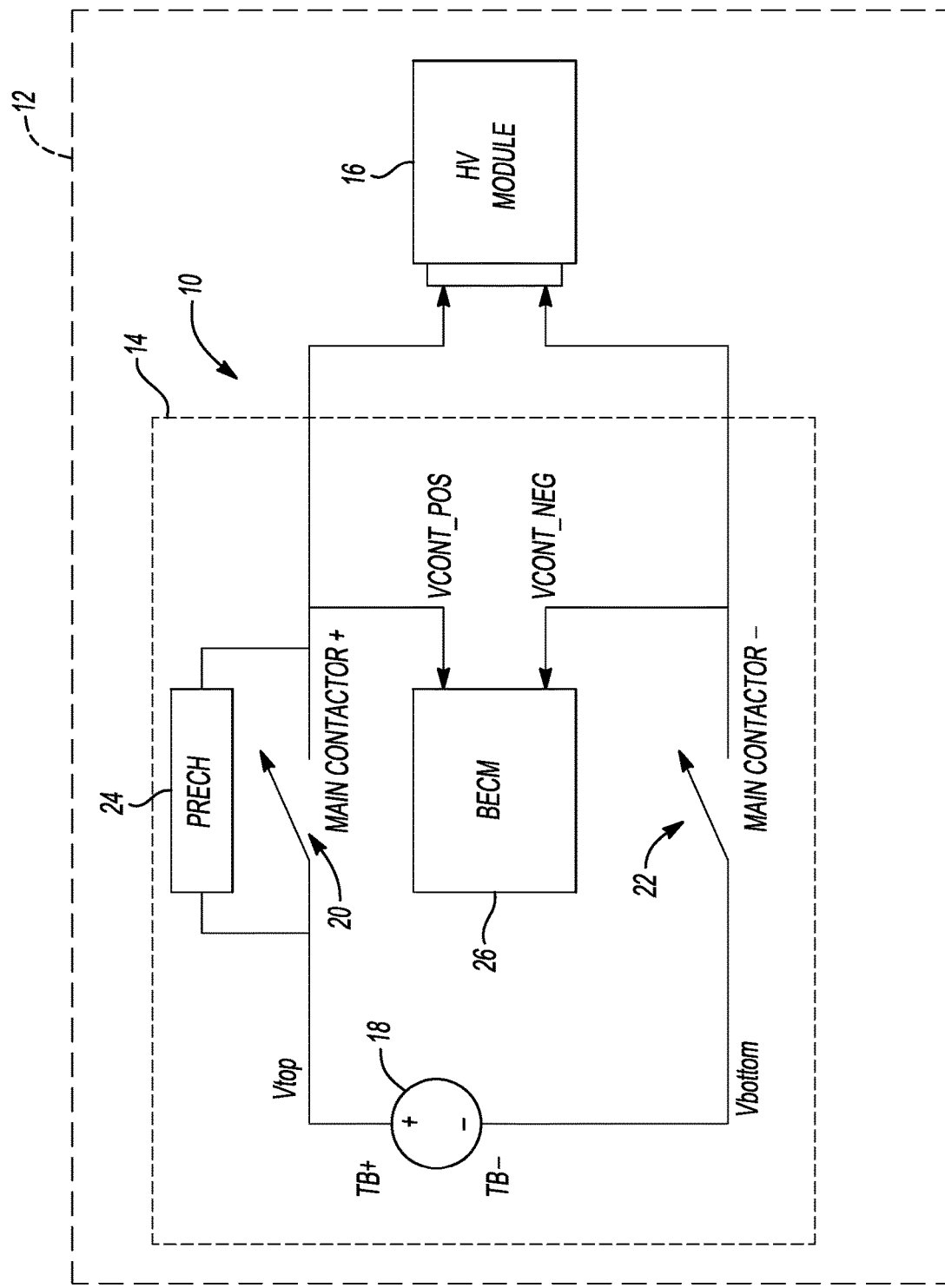
FIG. 1 is a schematic diagram of a high voltage system for a vehicle.

Referring to FIG. 1, a high voltage system 10 for a vehicle 12 includes a traction battery system 14 and electric machine 16. The traction battery system 14 includes a traction battery 18, main contactors 20, 22, a pre-charge contactor 24, and a BECM 26. These components will be referenced in further discussions below.

Figure 2:
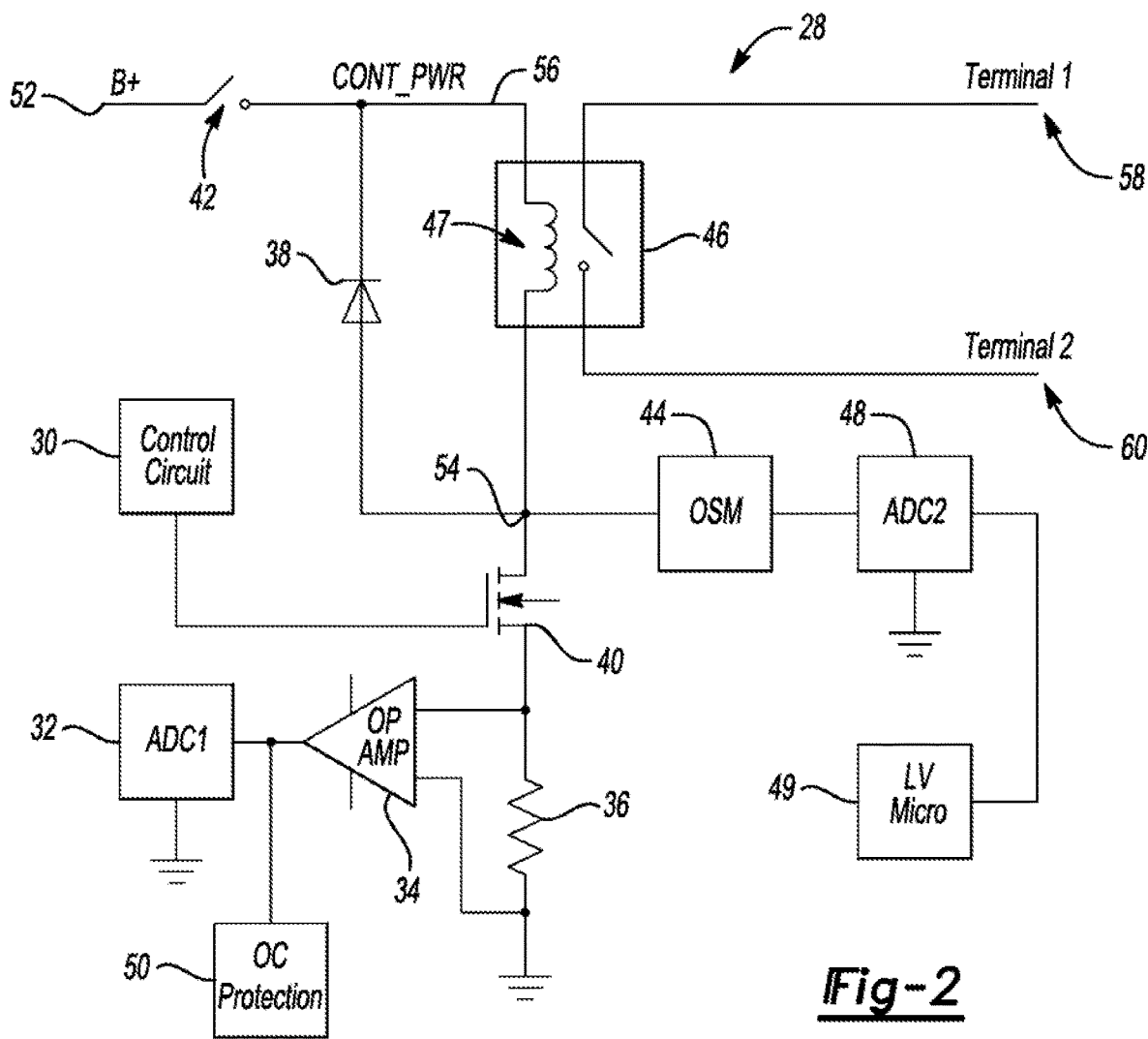
FIG. 2 is a schematic diagram of contactor control circuitry.

Referring to FIG. 2, contactor control circuitry 28 includes control circuit 30, A-D converter 32, operational amplifier 34, sense resistor 36, flyback diode 38, field effect transistor 40, switch 42, octo SOI MOSFET (OSM) 44, contactor 46 including coil 47, A-D converter 48, low voltage micro controller 49, over current protection circuit 50, B+ node 52, node 54, contactor power node 56, and terminals 58, 60. The contactor 46 can represent any contactor that may be used in electrified vehicles, including but not limited to main contactors 20, 22, DC fast charge contactors, auxiliary contactors, etc. The pre-charge contactor 24 is not included because it is controlled with a different strategy from the control of the above-mentioned contactors. The B+ node 52 is the 12V power supply from the low voltage battery (typically a 12V battery or 24V battery). When switch 42 is closed, the 12V power supply from the B+ node 52 will pass through the switch 42 and provide power to the contactor power node 56 for contactor control.

The control circuit 30 is used to drive the field effect transistor (e.g., MOSFET) 40. When the control circuit 30 closes the MOSFET 40, current from the contactor power node 56 can pass through the coil 47, MOSFET 40, and the sense resistor 36. The voltage across the sense resistor 36 is read by operational amplifier 34 and A-D converter 32 as an analog signal. This analog signal can be passed to the low voltage microcontroller 49 for analysis and control. The output of operational amplifier 34 is also monitored by over current protection circuit 50, which is used to protect the coil 47 from overcurrent. When the control circuit 30 opens the MOSFET 40, current through the coil 47 will not disappear immediately because of the intrinsic characteristic of the inductance of the coil 47. To prevent any sudden voltage spike from affecting the MOSFET 40 and/or other components, the fly-back diode 38 is used to provide a path for current to flow back to the coil 47. The OSM 44 monitors the voltage status of node 54, which is the drain of the MOSFET 40. The output of the OSM 44 is sampled by the A-D converter 48, and then passed to the low voltage microcontroller 49 mentioned earlier.

To drive the contactor 46, it requires large current (peak current) at the very beginning, and then a smaller current (hold current) is required to keep the contactor status. Therefore, a pulse width modulated (PWM) controlled gate driver is proper for contactor control to lower the power consumption and maintain the hold current. The control circuit 30 performs as the PWM gate driver for the MOSFET 40. To have the contactor 46 pull in and pull through quickly and efficiently, the control circuit 30 outputs a high duty ratio PWM control signal at the very beginning, meanwhile the low voltage microcontroller 49 reads the current though the coil 47 via the A-D converter 32, operational amplifier 34, and sense resistor 36 as mentioned above. Once the contactor 46 is stable, the control circuit 30 will then reduce the duty ratio of the PWM to a certain level (e.g., 50%) to maintain the hold current of the coil 47. In certain examples, the PWM frequency is usually no less than 20 kHz to avoid identifiable noise for users.

There are usually two issues that impact contactors. The first is an unintended open while the contactor is supposed to be closed, and the second is contact welding, in which the contactor will not open again. The traditional method to diagnose unintended open and contact welding is to measure the voltages of both terminals, 58, 60. To describe the traditional diagnosis method in more detail, we can use the main contactor 20 of FIG. 1 as an example. When the contactor 46 of FIG. 2 represents the main contactor 20, the terminals 58, 60 of FIG. 2 respectively represent the Vtop and Vcont_pos nodes of FIG. 1. To identify the status of the main contactor 20, the Vtop and Vcont_pos nodes should be measured in real-time frequently. If the voltage difference between the Vtop and Vcont_pos nodes is less than a pre-defined threshold, e.g., 20V, it indicates that the main contactor 20 is closed. Otherwise, the main contactor 20 is open. Generally speaking, the voltage readings of the Vcont_pos node and other contactor terminals cannot be replaced with the readings from messages reported by other control modules, e.g., the inverter and DCDC converter, since contactor management is an automotive safety integrity level rated function inside the BECM 26, and there is a principle of containing the automotive safety integrity level rated functions within the item when possible. Therefore, extra wires are required for the connections between the controller (e.g., BECM 26) and Vtop and/or Vcont_pos nodes. Extra wires are also required for any other contactors to be diagnosed inside the electrified vehicles. To eliminate these wires and maintain reliability of the diagnosis of contactor status, a few novel methods are presented here.

Figure 3:
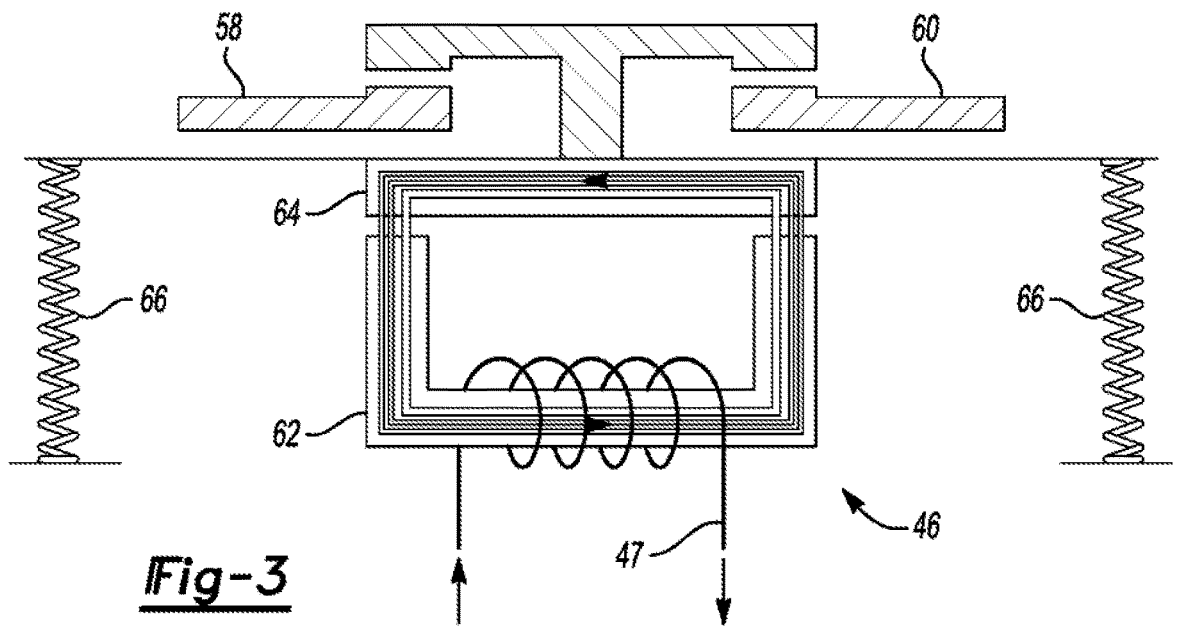
FIG. 3 is a schematic diagram of a contactor.

Referring to FIG. 3, the contactor 46 also includes a stationary electromagnet 62, armature 64, and spring 66. When there is sufficient current through the contactor coil 47, the armature 64 will move down to create a low resistance path between the terminals 58, 60. Then the armature 64 and the stationary electromagnet 62 form a flux path without air gap. However, when there is not enough current to hold the armature 64, the contactor 46 will be opened by the spring 66. Therefore, the inductance of the coil 47 varies under these two different conditions. Typically, the inductance of the coil 47 is larger when contactor 46 is closed. Different inductance will result in different transient voltage/current responses of the coil 47. Specifically, the larger the inductance, the larger time constant and smaller peak current can be expected. For an unintended open, it can be detected when the contactor is supposed to be closed. For contact welding, it can be detected when the contactor is supposed to be open. Since inductances of the coil 47 under different conditions (open and close) are known parameters, the following methods are proposed to diagnose these conditions without measuring the voltages of the terminals 58, 60.

When the electrified vehicle is in a key-on state, the contactor 46 is supposed to be closed during normal operating conditions. Although the inductance difference (e.g., 8 mH at open and 13 mH at closed) of the contactor 46 under the two conditions are different (peak current for different inductances are of a little difference, which is difficult to be accurately identified), the current level is mainly determined by the coil resistance and voltage (regulated by the PWM duty ratio and voltage of the power source). The proposed novel methods can address this issue.

The figures are used as examples to explain key concepts, but the techniques can be applied to any contactor control with similar structure.

Detecting Unintended Open

Figure 4:
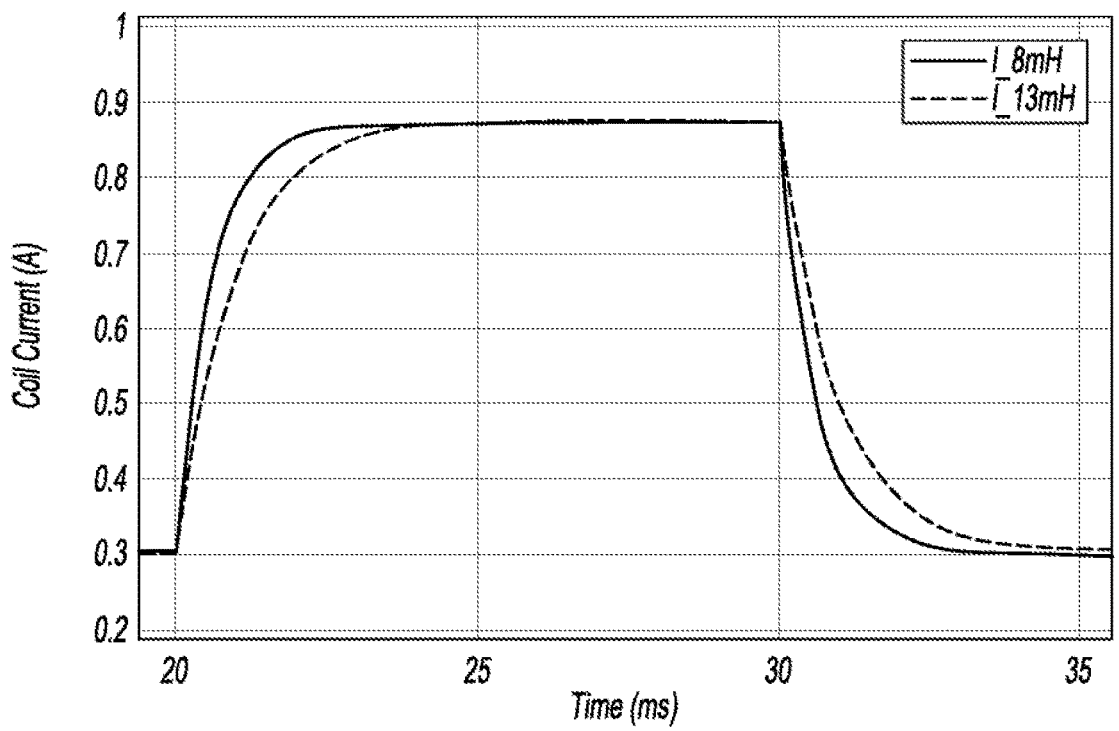
FIGS. 4 and 5 are plots of contactor coil current versus time.

Method 1, Step 1) The contactor 46 is in closed state, and the control circuit 30 outputs a predefined duty ratio (or adjusted duty ratio by feedback control to maintain contactor hold current) PWM control signal to drive the MOSFET 40 to maintain the hold current of the coil 47. FIG. 4 describes the process, in which the solid line is the curve of the current through the coil 47 when the contactor 46 is open, and the dash line is the curve of the current through the coil 47 when the contactor 46 is closed. The currents under different inductance of the coil 47 are all around 300 mA before 20 ms. This is also the current to hold the closed state.

Step 2) To maintain the normal operation of the electrified vehicle, the control circuit 30 is only allowed to increase the output duty ratio gradually to 100% for a very short period, e.g., 10 ms. As shown in FIG. 4, a 10% duty ratio is output by the control circuit 30, and the current through the coil 47 then reaches a fixed value after a transient response. During this process, the low voltage microcontroller 49 samples the voltage across the sense resistor 36 via the operational amplifier 34 and A-D converter 48 as quickly as possible. Then the time constant and inductance can be roughly determined. The time constant can be calculated by measuring the time it takes for the current through the coil 47 to decay to a value equal to the product of the initial value of the current at the beginning of the off portion of the duty cycle and the inverse of the number e. The inductance of the coil 47 can be calculated as the product of the time constant and the known resistance of the sense resistor 36.

Step 3) In step 2), the PWM duty ratio is increased and the current increases accordingly, which is higher than the desired contactor hold current. Moreover, to determine the time constant and inductance of the coil 47 more accurately, the control circuit 30 will restore the PWM duty ratio to its normal value to measure the reverse transient process. As seen in FIG. 4, from 30 ms, the current through the coil 47 is decreasing because of the decrease of PWM duty ratio. Again, the low voltage micro controller 49 samples the voltage across the sense resistor 36 via the operational amplifier 34 and A-D converter 48 as quickly as possible. Then the time constant and inductance can be determined as described above.

Step 4) By the measurements and calculations in Step 2) and Step 3), the time constant and the inductance of the coil 47 can be determined. If the result is the same as the dash curve, it indicates that the contactor 46 is closed, and there is no unintended open. Otherwise, if the result is the same as the solid curve, there is an unintended open. That is, known data representing proper operation of the contactor while open and closed can be stored in memory and used for comparison purposes against measured data during operation.

By applying Steps 1) to 4) periodically during key-on states, the vehicle can identify unintended open of contactors without measuring voltages of the terminals 58, 60.

In Method 1, note that the upper duty ratio need not be 100%. Because a 100% PWM duty ratio may reduce the life of the contactor 46, and the time constant can also be identified without reaching 100% PWM duty ratio. Therefore, a higher PWM duty ratio than the hold current PWM duty ratio can be determined by experiments and characteristics of the coil 47. Moreover, the period of applying high a PWM duty ratio can also be adjusted by considering the contactor characteristics. In the example of FIG. 4, 5 ms is adequate for the diagnosis process. The above-mentioned ideas can help to prolong the contactor life and the efficiency of the method.

Contact welding is another issue to be identified frequently. This issue can only be detected when the contactor 46 is supposed to be open. When the electrified vehicle is turned to on (from key-off to key-on), the BECM 26 will try to close the contactors 20, 22. This is the first scenario to apply Method 2 presented below to identify contact welding.

Detecting Contact Welding

Method 2 measures peak current through the coil 47. Due to the variation of inductance with the contactor status, the peak current also varies with the inductance. Especially when the PWM duty ratio is low, e.g., around 10% PWM duty ratio, the peak current difference is significant and can be easily identified by properly selecting the sense resistor 36. Method 2 can be performed as follows.

Step 1) Determination of the PWM duty ratio. Due to the uncertainty of voltage of the B+ node 52, the peak current through the contactor coil 47 at a fixed duty ratio will vary with the voltage of the B+ node 52. Therefore, it is difficult to apply a fixed duty ratio to measure the peak current through coil 47. To address this issue, there are two possible methods: Method 2a and Method 2b.

Method 2a measures the voltage of the B+ node 52 and uses a pre-determined look-up table to obtain a PWM duty ratio that maintains a fixed and low average current, e.g., 100 mA (when contactor hold current is 300 mA).

Method 2b applies a 20 kHz PWM signal and uses a feedback method to adjust the PWM duty ratio to obtain 100 mA current through the coil 47. By the above-mentioned two methods, the PWM duty ratio can be determined to maintain low current less than that sufficient to cause the contactor to close.

Step 2) The control circuit 30 outputs a PWM signal at a duty ratio determined in Step 1) and 500 Hz switching frequency (besides the above-mentioned Methods 2a and 2b, the rule to determine the duty ratio and switching frequency is to make sure there is significant peak current difference between the two inductances of the coil 47). Meanwhile, the low voltage micro controller 49 reads the current through the current sampling circuit including the A-D converter 48, operational amplifier 34, and sense resistor 36 repeatedly and quickly.

Figure 5:
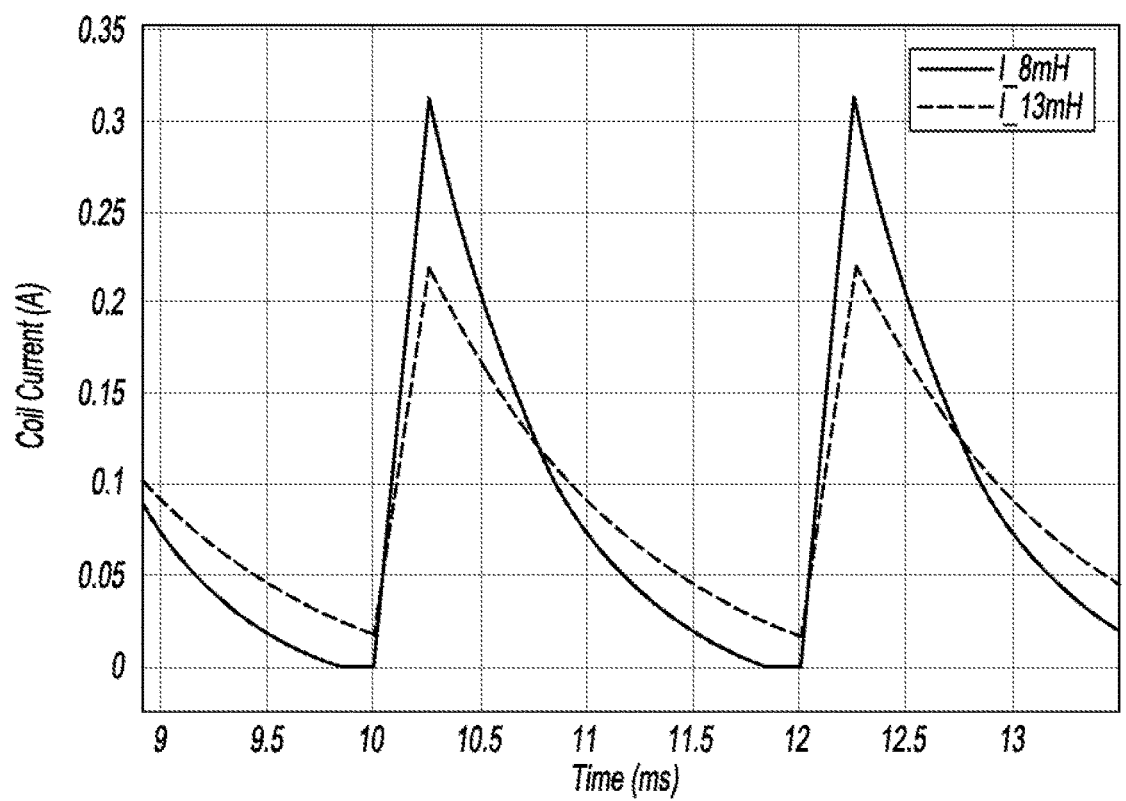

Step 3) Determine the contactor status. Peak current is obtained in Step 2). Since the contactor 46 is assumed to be open, the inductance of the coil 47 is supposed to be the smaller one, such that the peak current is supposed to be the larger. Consequently, if the peak current is smaller than expected, the contact welding condition can be confirmed. The 500 Hz switching frequency can be noisy to users. However, this method only requires tens of milliseconds, which is less than 5 seconds. FIG. 5 illustrates the peak currents through the coil 47 under different coil inductance (8 mH and 13 mH), where the solid line is the current curve with 8 mH coil inductance, and the dash line is the current curve with 13 mH coil inductance. In this example, the PWM duty ratio is 13%, and the switching frequency is 500 Hz (other values, however, may be used). The current difference is around 100 mA, which can be easily identified. To avoid false positives, the measurements of peak current can be performed repeatedly for several times, as it will not take too long.

The second scenario to diagnose contact welding is when the electrified vehicle is turned to off (from key-on to key-off) or upon completion of a DC fast charge event. In these cases, the contactors are supposed to be open after key-off or completion of a DC fast charge event.

Responsive to either method, if a contactor is found to be closed when it is supposed to be open, or open when it is supposed to be closed, the BECM 26 or other controller can set a fault condition flag. This fault condition flag, in certain examples, precludes subsequent start of the vehicle.

The processes, methods, or algorithms disclosed herein can be deliverable to implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure and claims.

As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A system for a vehicle comprising:
 a contactor, including a coil, arranged to close responsive to current magnitude through the coil exceeding a first threshold; and
 a controller programmed to,
  following a request to open the contactor, apply current to the coil at a magnitude less than the first threshold for a duration, and
  responsive to peak current through the coil during the duration being less than a second threshold, prevent start of the vehicle.

2. The system of claim 1, wherein the request to open the contactor is generated responsive to completion of a DC fast charge event.

3. The system of claim 1, wherein the request to open the contactor is generated responsive to shut down of the vehicle.

4. The system of claim 1, wherein the controller is further programmed to, responsive to peak current through the coil during the duration being less than the second threshold, set a fault condition flag.

5. The system of claim 1, wherein the contactor is arranged to electrically connect a traction battery and high voltage bus.

6. The system of claim 1, wherein the duration is less than five seconds.

7. A method for a vehicle comprising:
 by a controller,
  following a request to open a contactor, including a coil, arranged to close responsive to current magnitude through the coil exceeding a first threshold, applying current to the coil at a magnitude less than the first threshold for a duration, and
  responsive to peak current through the coil during the duration being less than a second threshold, setting a fault condition flag.

8. The method of claim 7 further comprising generating the request to open the contactor responsive to completion of a DC fast charge event.

9. The method of claim 7 further comprising generating the request to open the contactor responsive to shut down of the vehicle.

10. The method of claim 7 further comprising, responsive to peak current through the coil during the duration being less than a second threshold, preventing start of the vehicle.

11. The method of claim 7, wherein the duration is less than five seconds.

12. A system for a vehicle comprising:
 a contactor arranged to electrically connect a traction battery and high voltage bus; and
 a controller programmed to apply current to a coil of the contactor at a duty cycle during propulsion of the vehicle via the traction battery to command the contactor closed, and to selectively set a fault condition fag according to a rate of decay of the current through the coil detected during an off portion of the duty cycle.

13. The system of claim 12, wherein the rate of decay is indicative of an inductance of the coil.

14. The system of claim 12, wherein the rate of decay is greater when the contactor is open than when the contactor is closed.

15. The system of claim 12, wherein the duty cycle is greater than 40%.

16. The system of claim 12, wherein the fault condition flag is indicative of the contactor being opened.

* * * * *